(12) United States Patent
Kawamura

(10) Patent No.: US 10,613,156 B2
(45) Date of Patent: Apr. 7, 2020

(54) GROUND FAULT DETECTION APPARATUS

(71) Applicant: Yazaki Corporation, Tokyo (JP)

(72) Inventor: Yoshihiro Kawamura, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 68 days.

(21) Appl. No.: 16/126,934

(22) Filed: Sep. 10, 2018

(65) Prior Publication Data

US 2019/0086464 A1  Mar. 21, 2019

(30) Foreign Application Priority Data

Sep. 21, 2017  (JP) .................................. 2017-181183

(51) Int. Cl.

| G01R 31/00 | (2006.01) |
|---|---|
| G01R 31/50 | (2020.01) |
| B60L 58/10 | (2019.01) |
| G01R 31/64 | (2020.01) |
| B60L 3/00 | (2019.01) |
| G01R 27/02 | (2006.01) |
| G01R 31/14 | (2006.01) |

(52) U.S. Cl.
CPC ............ *G01R 31/50* (2020.01); *B60L 3/0069* (2013.01); *B60L 58/10* (2019.02); *G01R 27/025* (2013.01); *G01R 31/14* (2013.01); *G01R 31/64* (2020.01); *G01R 31/006* (2013.01)

(58) Field of Classification Search
CPC .... G01R 31/025; G01R 31/02; G01R 31/024; G01R 27/025; G01R 31/028; G01R 31/14; G01R 31/006; B60L 58/10; B60L 3/0069

See application file for complete search history.

(56) References Cited

U.S. PATENT DOCUMENTS

| 9,575,110 | B2 * | 2/2017 | Kawamura | ............ | G01R 31/14 |
| 2009/0066291 | A1 * | 3/2009 | Tien | ...................... | H02J 7/0016 |
| | | | | | 320/118 |
| 2011/0006781 | A1 * | 1/2011 | Kawamura | .......... | G01R 31/025 |
| | | | | | 324/551 |
| 2014/0021961 | A1 * | 1/2014 | Yamada | ............... | G01R 31/025 |
| | | | | | 324/503 |

(Continued)

FOREIGN PATENT DOCUMENTS

JP     2015-206784 A    11/2015

*Primary Examiner* — Jeff W Natalini
(74) *Attorney, Agent, or Firm* — Kenealy Vaidya LLP

(57) ABSTRACT

A ground fault detection apparatus connected to an ungrounded battery supplying power via a step-up circuit to a load and calculating insulation resistance of a system provided with the battery to detect a ground fault includes a capacitor, a set of switches switching among a V0 measurement path, a Vcn measurement path, and a Vcp measurement path, a bypass resistor connected in parallel with the negative-electrode-side insulation resistance via a normally open switch, and a control unit configured to, when the insulation resistance is to be calculated based on a charge voltage measurement value of the capacitor in each of the measurement paths, in a case in which the charge voltage measurement value of the capacitor in the Vcn measurement path is regarded as 0, switch the normally open switch to a closed state and measure the charge voltage of the capacitor in the Vcn measurement path.

4 Claims, 7 Drawing Sheets

(56) References Cited

U.S. PATENT DOCUMENTS

2014/0333321 A1* 11/2014 Kawamura ........... B60L 3/0069
　　　　　　　　　　　　　　　　　　　　　324/509
2015/0293167 A1　10/2015 Kawamura

* cited by examiner

GROUND FAULT DETECTION APPARATUS

BACKGROUND

Technical Field

The present invention relates to a ground fault detection apparatus using a flying capacitor.

Related Art

In a vehicle such as a hybrid car including an engine and an electric motor as driving sources and an electric vehicle, a battery mounted on a vehicle body is charged, and driving power is generated with use of electric energy supplied from the battery. In general, a power supply circuit related to a battery is configured as a high-voltage circuit using as high voltage as 200V or higher, and for ensuring safety, the high-voltage circuit including the battery is in an ungrounded configuration of being electrically insulated from a vehicle body serving as a reference potential point of a ground.

Also, some vehicles include a step-up circuit which steps up positive electric potential of the battery and supplies the potential to a load to improve a driving efficiency of the load. In the vehicle including the step-up circuit, an output of the battery or a primary side of the step-up circuit and an output of the step-up circuit or a secondary side thereof are in ungrounded configurations of being electrically insulated from a vehicle body, and the vehicle has a configuration in which the vehicle body is not used as a ground for the battery and the step-up circuit. For this reason, in the vehicle including the step-up circuit, insulation resistance between the battery and the ground and insulation resistance between the secondary side of the step-up circuit and the ground need to be detected to monitor a ground fault state.

To monitor the ground fault state between a system provided with the battery and the step-up circuit, specifically, a main power supply system ranging from the battery via the step-up circuit to the load such as an electric motor, and the vehicle body, a ground fault detection apparatus is provided. As the ground fault detection apparatus, one of a type using a capacitor called a flying capacitor is widely used.

FIG. 7 is a block diagram illustrating a configuration example of a conventional ground fault detection apparatus 500 of the flying capacitor type. The ground fault detection apparatus 500 is connected to an ungrounded battery 520 to detect a ground fault of a system provided with the battery 520 and a step-up circuit 530. The ground fault detection apparatus 500, the step-up circuit 530, a load 540, and the like are controlled by an external control device 510 serving as a higher-level device.

In this apparatus, insulation resistance between a positive electrode of an output side of the battery 520 or a primary side and a ground is referred to as RLp1, and insulation resistance between a negative electrode and the ground is referred to as RLn1. Also, insulation resistance between a positive electrode of an output side of the step-up circuit 530 or a secondary side and the ground is referred to as RLp2, and insulation resistance between a negative electrode and the ground is referred to as RLn2. Positive-electrode-side insulation resistance RLp is combined resistance of RLp1 and RLp2, and negative-electrode-side insulation resistance RLn is combined resistance of RLn1 and RLn2. Combined resistance of the positive-electrode-side insulation resistance RLp and the negative-electrode-side insulation resistance RLn is system insulation resistance RL.

A capacitor C1 functioning as the flying capacitor is configured to be charged through a path formed by on and off states of switches S1 to S4, and a control device 501 is configured to measure the charge voltage.

Known as a method for obtaining the insulation resistance RL is a technique for measuring V0, Vcn, and Vcp, calculating (Vcn+Vcp)/V0, and referring to table data prepared in advance based on an obtained calculation value to derive the insulation resistance RL. The ground fault detection apparatus 500 determines that a ground fault is generated in a case in which the obtained insulation resistance RL is below a predetermined reference value and outputs a warning to the external control device 510.

Note that V0 is a value corresponding to voltage of the battery 520 measured through a path formed by turning on the switches S1 and S2. Vcn is a voltage value including an influence of the negative-electrode-side insulation resistance RLn measured through a path formed by turning on the switches S1 and S4. Vcp is a voltage value including an influence of the positive-electrode-side insulation resistance RLp measured through a path formed by turning on the switches S2 and S3.

In general, in the ground fault determination, measurement is performed with V0 measurement, Vcn measurement, V0 measurement, and Vcp measurement regarded as one cycle, and each time the measurement is switched, charge voltage of the capacitor C1 is read, and the capacitor C1 is discharged through a path formed by turning on the switches S3 and S4.

Patent Literature 1: JP 2015-206784 A

SUMMARY

When the switches S1 and S4 are turned on to measure Vcn in a state in which the step-up circuit 530 is performing a step-up operation, a ground-side polar plate of the capacitor C1 is provided with voltage obtained by dividing stepped-up voltage by the positive-electrode-side insulation resistance RLp and the negative-electrode-side insulation resistance RLn.

In a case in which the voltage is higher than voltage applied from the positive electrode side of the battery 520, the capacitor C1 will be charged at a reverse polarity of a normal polarity due to flowing of current. In this case, voltage measured by the control device 501 will be 0, and the insulation resistance RL cannot be calculated. Thus, a system which goes into the stepped-up state frequently has a problem in which chances of calculation of the insulation resistance are reduced due to flowing of current from the secondary side.

An object of the present invention is to restrict reduction of chances of calculation of insulation resistance in a ground fault detection apparatus including a system including a step-up circuit.

To solve the problem, a ground fault detection apparatus of the present invention is a ground fault detection apparatus connected to an ungrounded battery supplying power via a step-up circuit to a load and that calculates insulation resistance of a system provided with the battery to detect a ground fault, the apparatus including: a capacitor configured to be operated as a flying capacitor; a set of switches configured to switch among a V0 measurement path including the battery and the capacitor, a Vcn measurement path including the battery, negative-electrode-side insulation resistance serving as insulation resistance between a negative electrode side of the battery and a ground, and the capacitor, and a Vcp measurement path including the battery, positive-electrode-side insulation resistance serving as insulation resistance between a positive electrode side of the battery and the ground, and the capacitor; a bypass resistor connected in parallel with the negative-electrode-side insulation resistance via a normally open switch; and a control unit configured to, when the insulation resistance is to be calculated based on a charge voltage measurement value of the capacitor in each of the measurement paths, in a case in which the charge voltage measurement value of the capacitor in the Vcn measurement path is regarded as 0, switch the normally open switch to a closed state and measure the charge voltage of the capacitor in the Vcn measurement path.

Here, in a case in which the charge voltage measurement value of the capacitor in the Vcn measurement path when the normally open switch is switched to the closed state is not regarded as 0, the control unit may calculate the positive-electrode-side insulation resistance with use of this charge voltage measurement value.

Furthermore, in a case in which the charge voltage measurement value of the capacitor in the Vcn measurement path when the normally open switch is switched to the closed state is regarded as 0, the control unit may calculate a maximum value of the positive-electrode-side insulation resistance based on a step-up ratio in the step-up circuit and a value of the bypass resistor.

According to the present invention, reduction of chances of calculation of insulation resistance can be restricted in a ground fault detection apparatus including a system including a step-up circuit.

DETAILED DESCRIPTION

Figure 1:
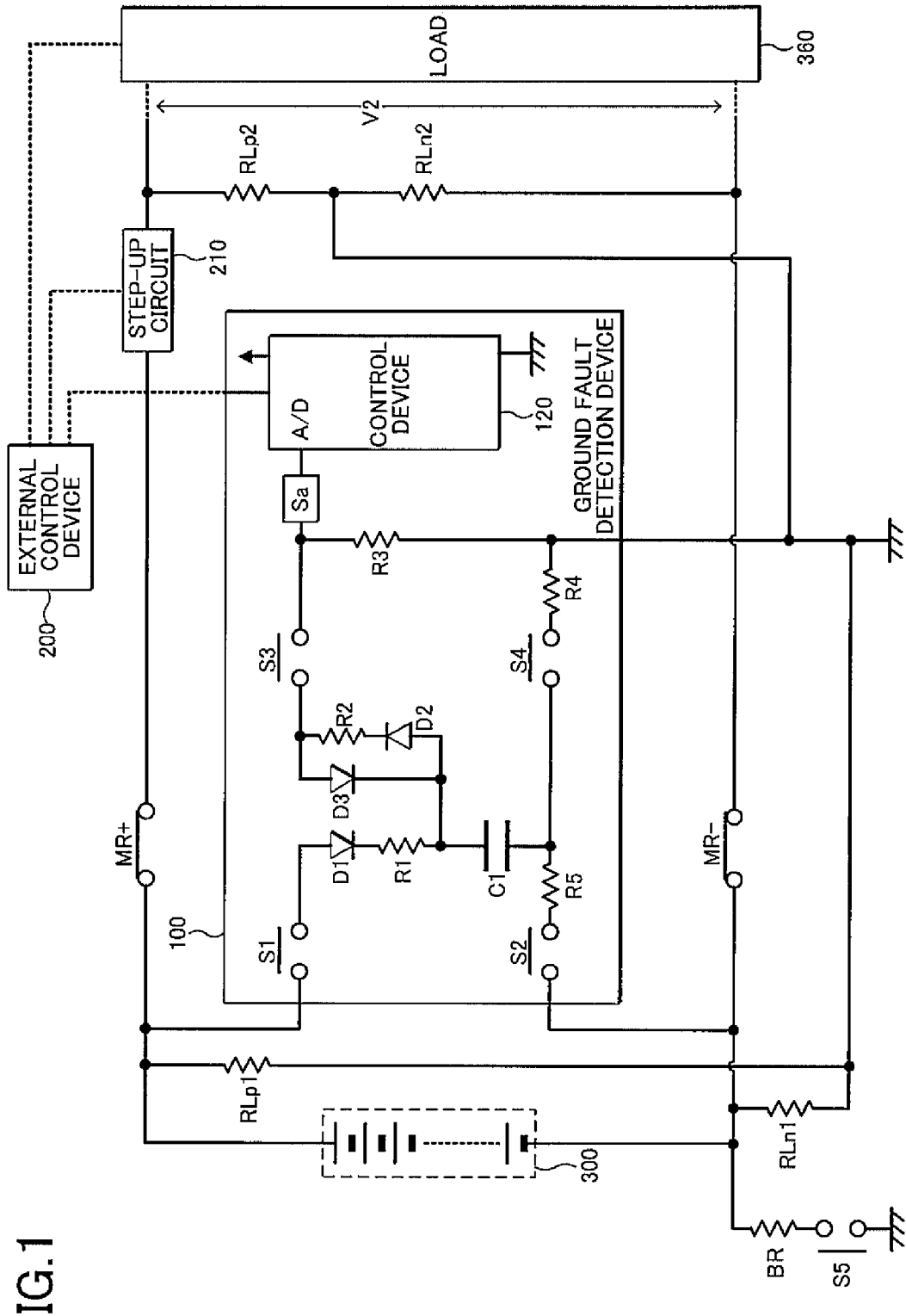
FIG. 1 is a block diagram illustrating a configuration of a ground fault detection apparatus according to an embodiment.

A ground fault detection apparatus serving as an embodiment of the present invention will be described with reference to the drawings. FIG. 1 is a block diagram illustrating a configuration of a ground fault detection apparatus 100 according to the present embodiment. The ground fault detection apparatus 100 is connected to an ungrounded battery 300 to detect a ground fault of a system provided with the battery 300 and a step-up circuit 210. The ground fault detection apparatus 100, the step-up circuit 210, a load 360, and the like are controlled by an external control device 200 serving as a higher-level device.

In this apparatus, insulation resistance between a positive electrode of an output side of the battery 300 or a primary side and a ground is referred to as RLp1, and insulation resistance between a negative electrode and the ground is referred to as RLn1. Also, insulation resistance between a positive electrode of an output side of the step-up circuit 210 or a secondary side and the ground is referred to as RLp2, and insulation resistance between a negative electrode and the ground is referred to as RLn2. Positive-electrode-side insulation resistance RLp is combined resistance of RLp1 and RLp2, and negative-electrode-side insulation resistance RLn is combined resistance of RLn1 and RLn2. Combined resistance of the positive-electrode-side insulation resistance RLp and the negative-electrode-side insulation resistance RLn is system insulation resistance RL.

The battery 300 is a chargeable battery such as a lithium ion battery. A positive electrode side thereof is connected via a main relay MR+ and the step-up circuit 210 to the load 360 such as an electric motor, and a negative electrode side thereof is connected via a main relay MR− to the load 360.

As illustrated in FIG. 1, the ground fault detection apparatus 100 includes a capacitor C1 functioning as a flying capacitor. As the capacitor C1, a ceramic capacitor can be used, for example.

The ground fault detection apparatus 100 also includes four switches S1 to S4 around the capacitor C1 to switch a measurement path and control charge/discharge of the capacitor C1. The ground fault detection apparatus 100 further includes a switch Sa configured to sample voltage for measurement corresponding to charge voltage of the capacitor C1. The switch Sa is turned on only at the time of sampling. Each of these switches can be an insulating switching element such as a photo MOSFET.

One end of the switch S1 is connected to a positive electrode of the battery 300 while the other end thereof is connected to an anode side of a diode D1. A cathode side of the diode D1 is connected to a resistor R1, and the other end of the resistor R1 is connected to a first polar plate of the capacitor C1.

One end of the switch S2 is connected to a negative electrode of the battery 300 while the other end thereof is connected to a resistor R5. The other end of the resistor R5 is connected to a second polar plate of the capacitor C1.

One end of the switch S3 is connected to a resistor R2 and an anode side of a diode D3 while the other end thereof is connected to a resistor R3 and one end of the switch Sa. A cathode side of the diode D3 is connected to the first polar plate of the capacitor C1, the other end of the resistor R2 is connected to a cathode side of the diode D2, and an anode side of the diode D2 is connected to the first polar plate of the capacitor C1. The other end of the resistor R3 is grounded.

One end of the switch S4 is connected to the second polar plate of the capacitor C1 while the other end thereof is connected to a resistor R4. The other end of the resistor R4 is grounded. The other end of the switch Sa is connected to an A/D terminal of a control device 120.

The control device 120 is a microcomputer or the like and executes a program installed in advance to control various operations in the ground fault detection apparatus 100. Specifically, the control device 120 controls the switches S1 to S4 individually to switch the measurement path and controls charge and discharge of the capacitor C1. The control device 120 also measures charge voltage of the capacitor C1 through the respective measurement paths, calculates insulation resistance, and determines a ground fault.

Also, the control device 120 controls the switch Sa, inputs an analog level corresponding to the charge voltage of the capacitor C1 from the A/D terminal, performs predetermined calculation based on the value, and calculates the insulation resistance RL. The measurement data and warnings of the control device 120 are output to the external control device 200.

In addition to the above configuration, which is similar to the conventional configuration, the ground fault detection apparatus 100 according to the present embodiment has a configuration in which a bypass resistor BR is connected via a normally open switch S5 between a negative electrode of the battery 300 and the ground, that is, in parallel with the negative-electrode-side insulation resistance RLn. The bypass resistor BR may be connected to the secondary side. Switching of the switch S5 is controlled by the control device 120 in a similar manner to the switches S1 to S4.

The bypass resistor BR is a resistor which, when Vcn cannot be measured due to flowing of current caused by an increase of stepped-up secondary side voltage V2 at the time of measurement of Vcn, forcibly lowers the negative-electrode-side insulation resistance to enable the positive-electrode-side insulation resistance RLp to be measured.

That is, the situation in which flowing of current occurs to make measurement impossible occurs in a case in which, due to the increase of the stepped-up secondary side voltage V2, ground potential divided by the positive-electrode-side insulation resistance RLp and the negative-electrode-side insulation resistance RLn increases and is higher than primary side voltage V1 and when $V1<(V2\times RLn/(RLn+RLp))$ is established. This is a state in which a step-up ratio in the step-up circuit 210 is high and in which the positive-electrode-side insulation resistance RLp is lower than the negative-electrode-side insulation resistance RLn. For example, in a case in which the step-up ratio is twice, measurement cannot be done at the time of negative-electrode-side insulation resistance RLn>positive-electrode-side insulation resistance RLp.

By decreasing the negative-electrode-side insulation resistance RLn by means of the bypass resistor BR, the right hand side decreases. Thus, a measurable range can be extended. That is, chances of calculation of the insulation resistance are reduced.

Meanwhile, since the negative-electrode-side insulation resistance RLn is bypassed by the bypass resistor BR, the insulation resistance RL obtained at this time can be regarded as combined resistance of the positive-electrode-side insulation resistance RLp and the bypass resistor BR. Since the value of the resistance BR is known, the positive-electrode-side insulation resistance RLp, which relatively decreases, can be calculated from the obtained insulation resistance RL.

When the value of the bypass resistor BR is too low, a ground fault state occurs. When the value of the bypass resistor BR is too high, this does not contribute to lowering of the negative-electrode-side insulation resistance RLn. Accordingly, the value of the bypass resistor BR is determined in consideration of maximum stepped-up voltage, a minimum allowable insulation resistance value, and the like. For example, the value can be 1 MΩ.

An operation of the ground fault detection apparatus 100 configured as above will be described. In the following description, the main relays MR+ and MR− are in on states.

Figure 2:
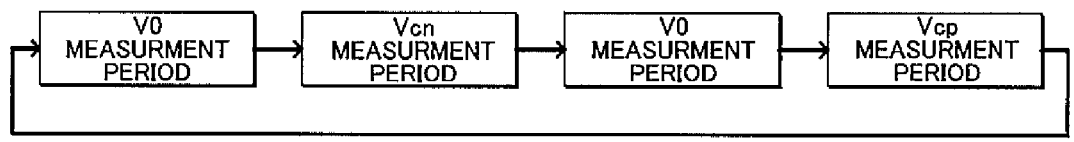
FIG. 2 illustrates a measurement cycle of the ground fault detection apparatus.

As illustrated in FIG. 2, the ground fault detection apparatus 100 repeats a measurement operation with V0 measurement period→Von measurement period→V0 measurement period→Vcp measurement period regarded as one cycle. In any of the measurement periods, the capacitor C1 is charged with voltage to be measured, and charge voltage of the capacitor C1 is then measured. The capacitor C1 is then discharged for the subsequent measurement.

Figure 3:
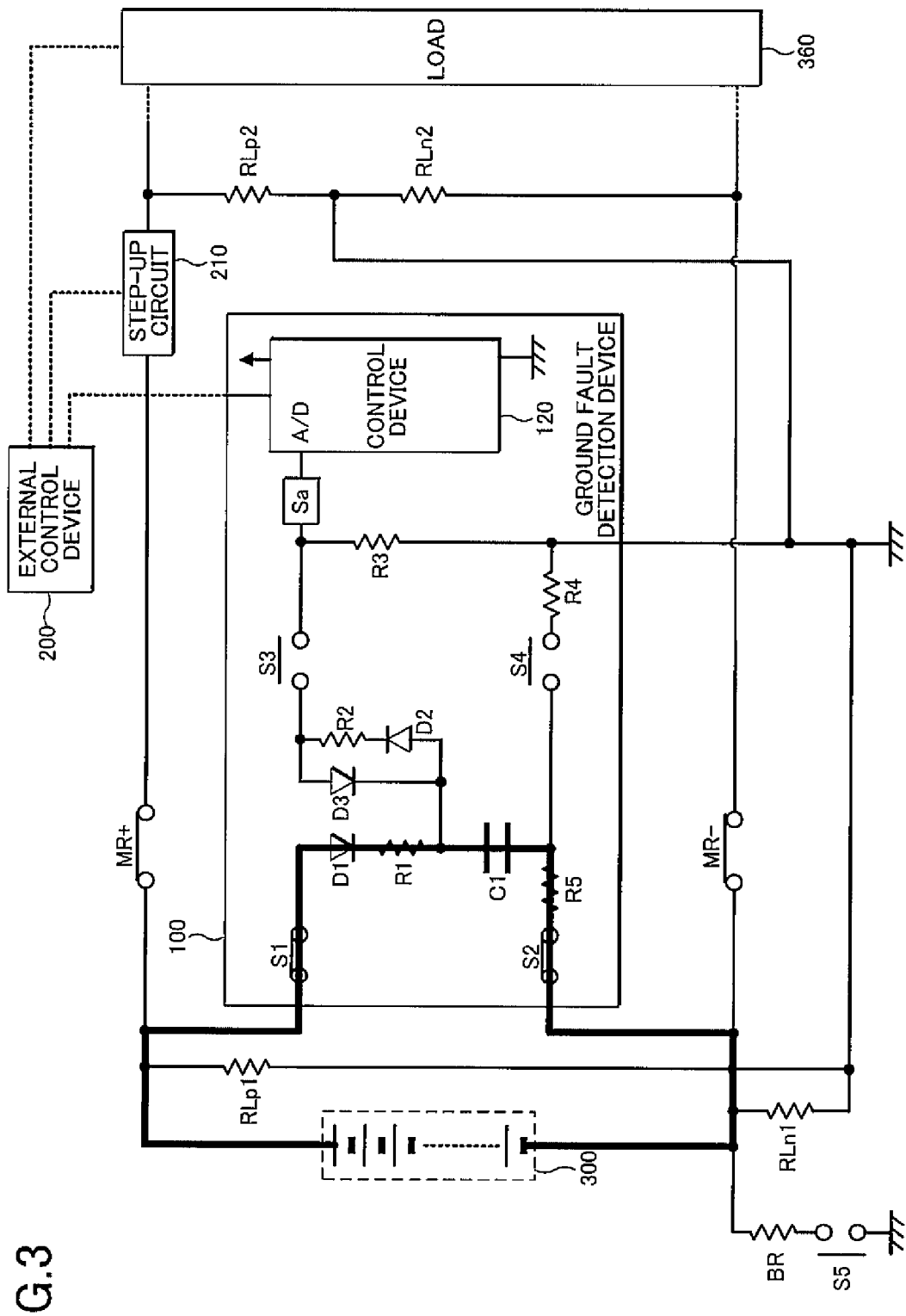
FIG. 3 illustrates a measurement path in a V0 measurement period.

In the V0 measurement period, voltage corresponding to voltage of the battery 300 is measured. Thus, the switches S1 and S2 are turned on, the switches S3 and S4 are turned off, and the capacitor C1 is charged. That is, as illustrated in FIG. 3, the battery 300 and the capacitor C1 are on the measurement path.

At the time of measurement of charge voltage of the capacitor C1, the switches S1 and S2 are turned off while the switches S3 and S4 are turned on, and sampling is performed in the control device 120. In addition, the capacitor C1 is discharged for the subsequent measurement. Operations at the time of measurement of charge voltage of the capacitor C1 and at the time of discharge of the capacitor C1 are similar in the other measurement periods.

Figure 4:
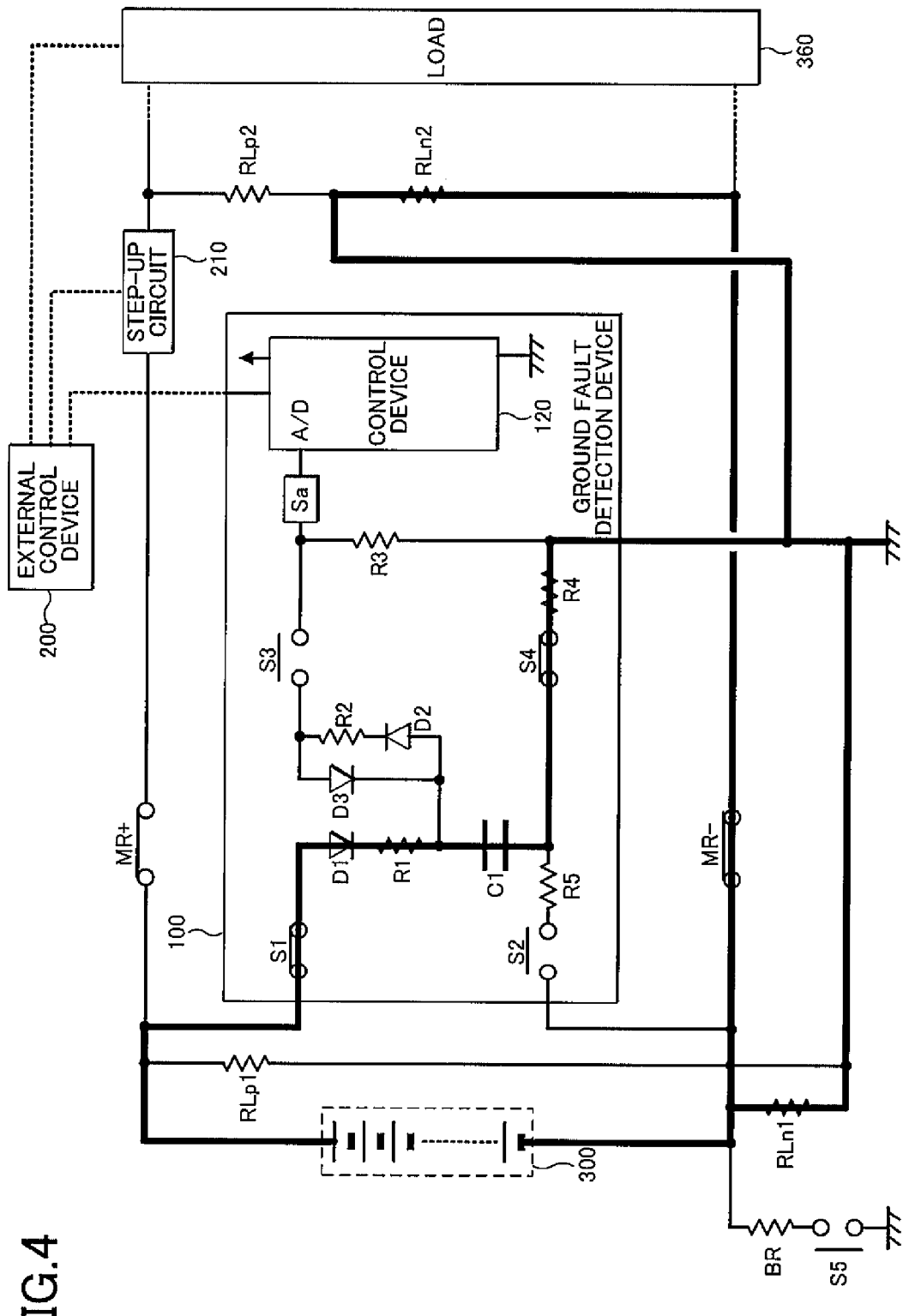
FIG. 4 illustrates a measurement path in a Vcn measurement period.

In the Vcn measurement period, voltage on which an influence of the negative-electrode-side insulation resistance RLn is reflected is measured. Thus, the switches S1 and S4 are turned on, the switches S2 and S3 are turned off, and the capacitor C1 is charged. That is, as illustrated in FIG. 4, the battery 300, the resistor R1, the capacitor C1, the resistor R4, and the negative-electrode-side insulation resistor RLn are on the measurement path.

Figure 5:
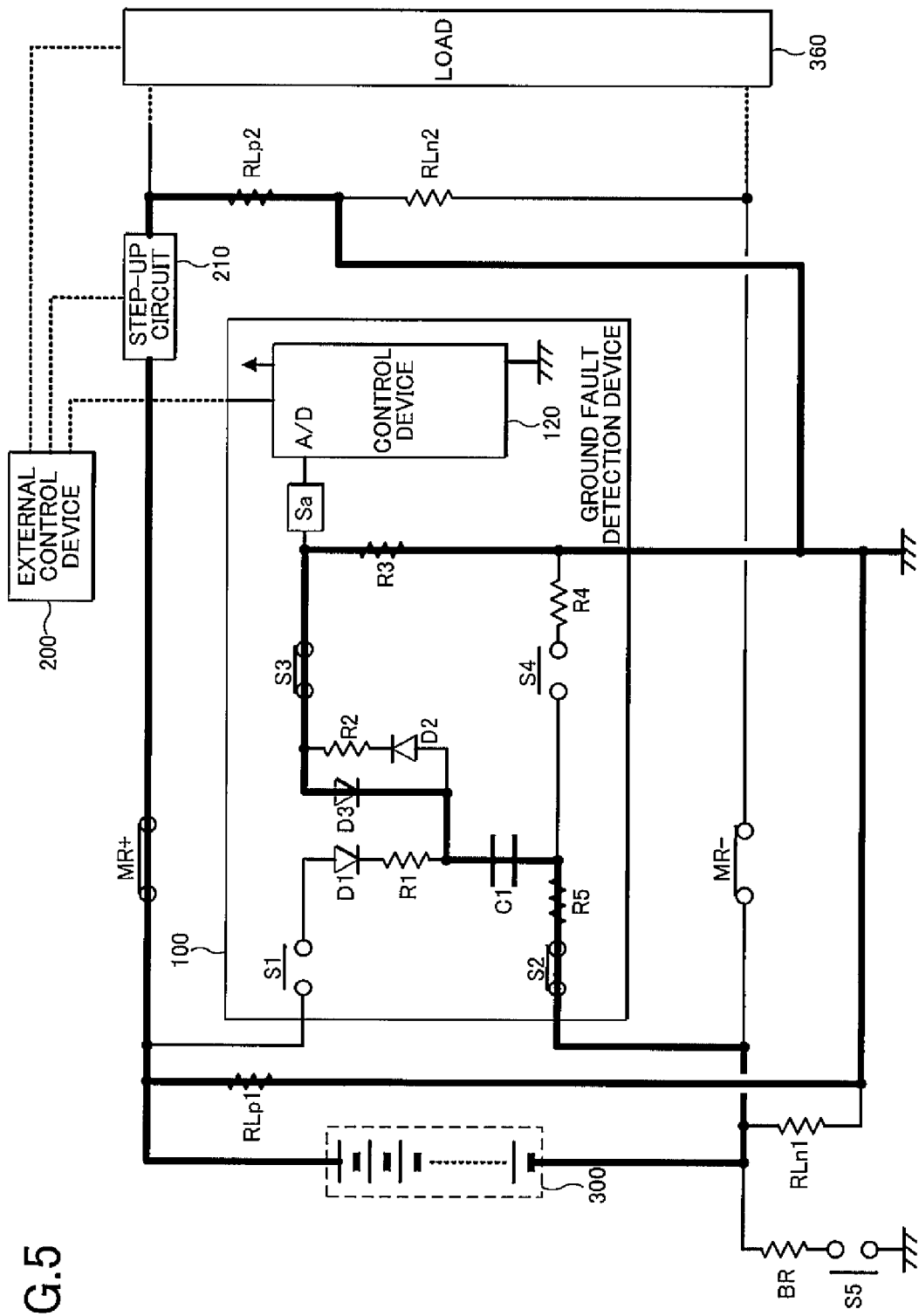
FIG. 5 illustrates a measurement path in a Vcp measurement period.

In the Vcp measurement period, voltage on which an influence of the positive-electrode-side insulation resistance RLp is reflected is measured. Thus, the switches S2 and S3 are turned on, the switches S1 and S4 are turned off, and the capacitor C1 is charged. That is, as illustrated in FIG. 5, the battery 300, a parallel circuit of the primary side positive electrode insulation resistor RLp1 and a circuit including the step-up circuit 210 and the secondary side positive electrode insulation resistor RLp2, the resistor R3, and the capacitor C1 are on the measurement path.

Based on (Vcp+Vcn)/V0 calculated from V0, Vcn, and Vcp obtained in these measurement periods, the control device 120 of the ground fault detection apparatus 100 calculates the insulation resistance RL with reference to table data prepared in advance. In a case in which the insulation resistance RL is equal to or less than a predetermined determination reference level, the control device 120 determines that a ground fault is generated and outputs a warning to the external control device 200.

Figure 6:
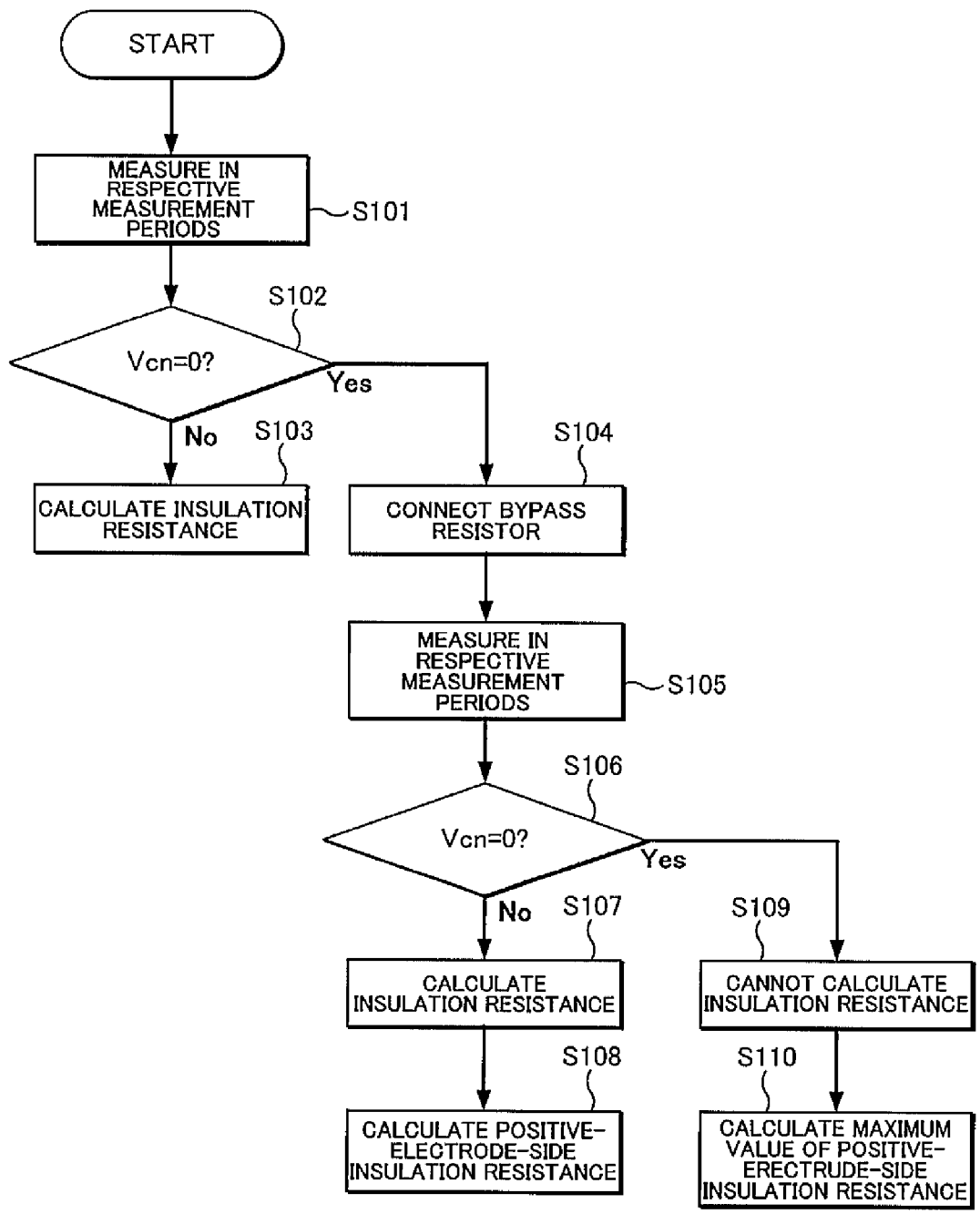
FIG. 6 is a flowchart illustrating an insulation resistance calculation operation in the ground fault detection apparatus according to the present embodiment.
Figure 7:
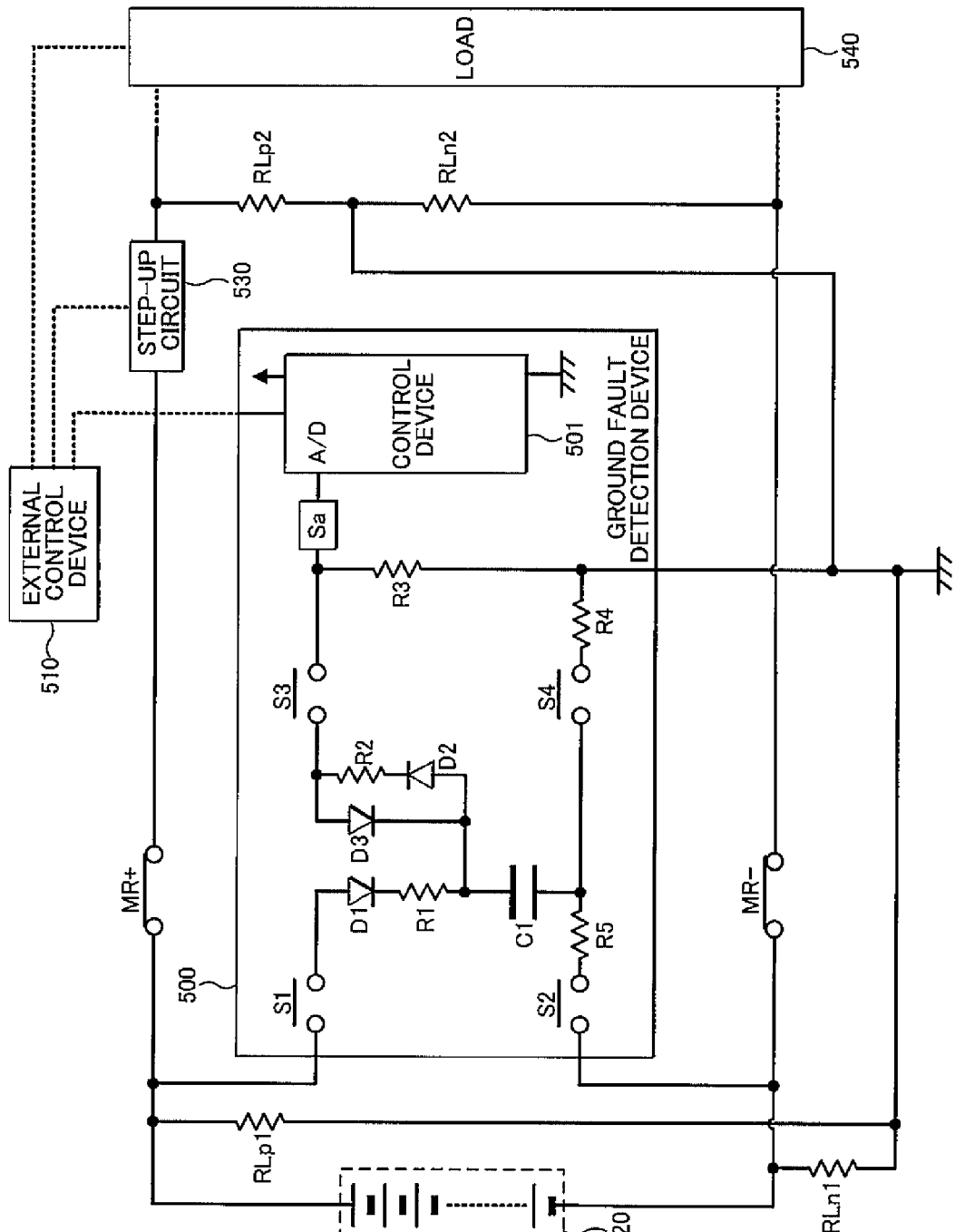
FIG. 7 is a block diagram illustrating a configuration example of a conventional ground fault detection apparatus of a flying capacitor type.

Next, an insulation resistance calculation operation in the ground fault detection apparatus 100 according to the present embodiment will be described with reference to the flowchart in FIG. 6. First, measurement in the respective measurement periods is performed (S101). As described above, in the measurement in the respective measurement periods, measurement is performed with V0 measurement period→Vcn measurement period→V0 measurement period→Vcp measurement period regarded as one cycle.

To determine whether or not flowing of current from the secondary side occurs, whether the measurement value in the Vcn measurement period is 0 is checked (S102). It is to be noted that, in consideration of an influence such as a noise, a value which is equal to or less than several 10 mV shall be regarded as 0, for example.

In a case in which the measurement value in the Vcn measurement period is not 0 (S102: No), normal calculation can be performed, and the insulation resistance RL is calculated based on the obtained measurement values in the respective measurement periods (S103).

On the other hand, in a case in which the measurement value in the Vcn measurement period is 0 (S102: Yes), flowing of current from the secondary side occurs, and normal calculation cannot be performed. Thus, the switch S5 is turned on to cause the bypass resistor BR to be in a connected state (S104).

In a state in which the bypass resistor BR is connected, measurement in the respective measurement periods is performed (S105). That is, measurement is performed with V0 measurement period→Vcn measurement period→V0 measurement period→Vcp measurement period regarded as one cycle.

To determine whether or not flowing of current from the secondary side occurs in a state in which the bypass resistor BR is connected, whether the measurement value in the Vcn measurement period is 0 is checked (S106). At this time as well, a value which is equal to or less than several 10 mV shall be regarded as 0, for example.

In a case in which the measurement value in the Vcn measurement period is not 0 in the state in which the bypass resistor BR is connected (S106: No), the insulation resistance RL can be calculated in the state in which the bypass resistor BR is connected. Thus, the insulation resistance RL is calculated in the same calculation method as in a normal case (S107).

However, the calculated insulation resistance RL can be regarded as combined resistance of the positive-electrode-side insulation resistance RLp and the bypass resistance BR. Hence, the calculated insulation resistance RL is not treated as insulation resistance for determination of a ground fault of the system, and the positive-electrode-side insulation resistance RLp is calculated from RL=RLp×BR/(RLp+BR) (S108). A ground fault on the positive electrode side can be determined from the calculated positive-electrode-side insulation resistance RLp.

On the other hand, in a case in which the measurement value in the Vcn measurement period is 0 in the state in which the bypass resistor BR is connected (S106: Yes), the insulation resistance cannot be calculated (S109). In this situation, due to the increase of the stepped-up secondary side voltage V2, ground potential divided by the positive-electrode-side insulation resistance RLp and the bypass resistance BR increases and is higher than primary side voltage V1, and V1<(V2×BR/(BR+RLp)) is established.

Thus, RLp<BR×(V2−V1)/V1 can be obtained. With use of the primary side voltage V1, the secondary side voltage V2, and the bypass resistance BR, a maximum value RLpmax of the positive-electrode-side insulation resistance RLp can be calculated. Accordingly, it is possible to detect that the positive-electrode-side insulation resistance RLp is at least equal to or less than RLpmax. Note that BR×(V2−V1)/V1 on the right hand side of the above inequation means a value obtained by multiplying a value derived by subtracting 1 from the step-up ratio by the bypass resistance BR.

Meanwhile, to calculate the maximum value of the positive-electrode-side insulation resistance RLp, the step-up ratio in the step-up circuit 210 needs to be obtained. In a case in which the control device 120 of the ground fault detection apparatus 100 cannot obtain the value, the external control device 200 may calculate the maximum value of the positive-electrode-side insulation resistance RLp. In this case, a part of the external control device 200 functions as the ground fault detection apparatus 100.

As described above, with the ground fault detection apparatus 100 according to the present embodiment, in a case in which the measurement value in the Vcn measurement period is 0, measurement is performed by connecting the bypass resistor BR. Thus, a range in which the positive-electrode-side insulation resistance RLp can be calculated can be extended. Accordingly, reduction of chances of calculation of insulation resistance can be restricted in a ground fault detection apparatus including a system including a step-up circuit.

Also, in a case in which the measurement value in the Vcn measurement period is 0 even in a state in which the bypass resistor BR is connected, the maximum value of the positive-electrode-side insulation resistance RLp can be calculated based on the values of the primary side voltage and the secondary side voltage or the step-up ratio in the step-up circuit 210.

REFERENCE SIGNS LIST 100 ground fault detection apparatus
120 control device
200 external control device
210 step-up circuit
300 battery
360 load
BR bypass resistor
C1 capacitor
RL insulation resistance
S1, S2, S3, S4, Sa switch

What is claimed is:

1. A ground fault detection apparatus that is connected to an ungrounded battery supplying power via a step-up circuit to a load and that calculates insulation resistance of a system provided with the battery to detect a ground fault, the apparatus comprising:
a capacitor configured to be operated as a flying capacitor;
a set of switches configured to switch among a V0 measurement path including the battery and the capacitor, a Vcn measurement path including the battery, negative-electrode-side insulation resistance serving as insulation resistance between a negative electrode side of the battery and a ground, and the capacitor, and a Vcp measurement path including the battery, positive-electrode-side insulation resistance serving as insulation resistance between a positive electrode side of the battery and the ground, and the capacitor;
a bypass resistor connected in parallel with the negative-electrode-side insulation resistance via a normally open switch; and
a control unit configured to, when the insulation resistance is to be calculated based on a charge voltage measurement value of the capacitor in each of the measurement paths, in a case in which the charge voltage measurement value of the capacitor in the Vcn measurement path is regarded as 0, switch the normally open switch to a closed state and measure the charge voltage of the capacitor in the Vcn measurement path.

2. The ground fault detection apparatus according to claim 1, wherein, in a case in which the charge voltage measurement value of the capacitor in the Vcn measurement path when the normally open switch is switched to the closed state is not regarded as 0, the control unit calculates the positive-electrode-side insulation resistance with use of this charge voltage measurement value.

3. The ground fault detection apparatus according to claim 1, wherein, in a case in which the charge voltage measurement value of the capacitor in the Vcn measurement path when the normally open switch is switched to the closed state is regarded as 0, the control unit calculates a maximum value of the positive-electrode-side insulation resistance based on a step-up ratio in the step-up circuit and a value of the bypass resistor.

4. The ground fault detection apparatus according to claim 2, wherein, in a case in which the charge voltage measurement value of the capacitor in the Vcn measurement path when the normally open switch is switched to the closed state is regarded as 0, the control unit calculates a maximum value of the positive-electrode-side insulation resistance based on a step-up ratio in the step-up circuit and a value of the bypass resistor.

* * * * *